(12) United States Patent
Beak et al.

(10) Patent No.: US 10,916,611 B2
(45) Date of Patent: Feb. 9, 2021

(54) ORGANIC LIGHT EMITTING DISPLAY DEVICE AND FABRICATING METHOD THEREOF

(71) Applicant: LG DISPLAY CO., LTD., Seoul (KR)

(72) Inventors: Jung Sun Beak, Paju-si (KR); Jeong Oh Kim, Goyang-si (KR); Jeong Gi Yun, Paju-si (KR); Yong Min Kim, Anyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/195,201

(22) Filed: Jun. 28, 2016

(65) Prior Publication Data

US 2016/0307985 A1    Oct. 20, 2016

Related U.S. Application Data

(62) Division of application No. 14/561,899, filed on Dec. 5, 2014, now Pat. No. 9,401,392.

(30) Foreign Application Priority Data

Dec. 31, 2013   (KR) .......................... 10-2013-0169090

(51) Int. Cl.
  *H01L 27/32* (2006.01)
  *H01L 21/033* (2006.01)

(52) U.S. Cl.
  CPC ........ *H01L 27/3265* (2013.01); *H01L 27/322* (2013.01); *H01L 27/3262* (2013.01); *H01L 21/0337* (2013.01); *H01L 2227/323* (2013.01)

(58) Field of Classification Search
  CPC .............. H01L 27/3262; H01L 27/322; H01L 27/3265; H01L 21/0337; H01L 2227/323
  See application file for complete search history.

(56) References Cited

U.S. PATENT DOCUMENTS

| | | | |
|---|---|---|---|
| 7,309,957 B2 | 12/2007 | Park et al. | |
| 7,923,916 B2 | 4/2011 | Heo et al. | |
| 8,536,778 B2 | 9/2013 | Heo et al. | |
| 2008/0018566 A1 | 1/2008 | Yamauchi et al. | |
| 2008/0018843 A1* | 1/2008 | Park ...................... | G02F 1/1339 349/139 |

(Continued)

FOREIGN PATENT DOCUMENTS

| | | |
|---|---|---|
| CN | 1496204 A | 5/2004 |
| CN | 1741696 A | 3/2006 |

(Continued)

*Primary Examiner* — Brigitte A Paterson
(74) *Attorney, Agent, or Firm* — Dentons US LLP

(57) ABSTRACT

Disclosed is an organic light emitting display device. The organic light emitting display device includes: at least one transistor arranged in a transistor region of the substrate and configured to include a channel layer, an insulation film, a gate electrode, a source electrode and a drain electrode; a storage capacitor arranged in the storage capacitor region, the pixel region and the pad region of the substrate and configured to include a first storage electrode, an insulation film pattern and a second storage electrode; a color filter arranged over the storage capacitor opposite to the pixel region; and an organic light emitting diode arranged on the color filter and configured to include a first electrode, an organic emission layer and a second electrode.

9 Claims, 7 Drawing Sheets

(56) References Cited

U.S. PATENT DOCUMENTS

| | | | | |
|---|---|---|---|---|
| 2014/0022480 A1* | 1/2014 | Yokoyama | ........ | G02F 1/133345 |
| | | | | 349/43 |
| 2014/0252317 A1 | 9/2014 | Gupta et al. | | |
| 2014/0320544 A1* | 10/2014 | Kim | ..................... | G09G 3/3233 |
| | | | | 345/690 |
| 2014/0353622 A1* | 12/2014 | You | ..................... | H01L 27/3248 |
| | | | | 257/40 |
| 2016/0035814 A1 | 2/2016 | Jin et al. | | |

FOREIGN PATENT DOCUMENTS

| | | | |
|---|---|---|---|
| CN | 101083261 | A | 12/2007 |
| CN | 102569340 | A | 7/2012 |
| JP | 2010-152221 | A | 7/2010 |
| KR | 10-2004-0017152 | A | 2/2004 |
| KR | 10-2008-0002192 | A | 1/2008 |
| KR | 10-2011-0056962 | A | 5/2011 |

\* cited by examiner

ORGANIC LIGHT EMITTING DISPLAY DEVICE AND FABRICATING METHOD THEREOF

The present application is a Divisional Application of U.S. application Ser. No. 14/561,899 filed Dec. 5, 2014, now allowed, and claims priority under 35 U.S.C. § 119(a) of Korean Patent Application No. 10-2013-0169090 filed Dec. 31, 2013, each of which are hereby incorporated by reference for all purposes in their entirety.

BACKGROUND

Field of the Disclosure

The present application relates to an organic light emitting display device. More particularly, the present application relates to an organic light emitting display device adapted to enhance an aperture ratio by allowing a storage electrode in a pixel region to become a transparent electrode, and to a fabricating method thereof.

Description of the Related Art

The general public has shown a keen interest in information display, and public demand for the use of portable information media is increasing. Flat panel display devices having features of thinness, lighter weight, and suitability to replace existing cathode ray tubes (CRTs) are being actively researched and commercialized.

In the flat panel display field, liquid crystal display (LCD) devices with features of light weight and low power consumption have been attracting public attention. However, the LCD devices have low brightness, a low contrast ratio and a narrow viewing angle because of being used as a light receiving element not a luminous element. As such, new display devices that are suitable to overcome the disadvantages of the LCD devices are actively being developed.

An organic light emitting display (OLED) device corresponding to one of the new display devices is a self-luminous device. In other words, the OLED device does not require any backlight. As such, the OLED device can provide advantages of a wider viewing angle, a superior contrast ratio, lower power consumption and so on, compared to the LCD device. Also, the OLED device can not only become thinner but also reduce weight. Moreover, the OLED device can be driven by a low DC (direct current) voltage, enhance the response time, and reduce the fabrication cost.

Such an OLED device can be fabricated using only deposition and encapsulation processes, unlike the LCD device and a plasma display panel (PDP). As such, the fabrication procedure of the OLED device is very simple. If pixels are driven in an active matrix mode which uses thin film transistors within each pixel as switching elements, the OLED device can obtain the same brightness as the LCD device even though it uses a small current. Therefore, the OLED device can reduce power consumption and be easy to realize high definition and a large-sized screen.

The basic structure and operation properties of an organic light emitting diode formed in each pixel region of the organic light emitting display device will now be described with reference to attached drawings.

FIG. 1 is a diagram illustrating an emission principle of an organic light emitting diode forming an ordinary organic light emitting display device.

The ordinary organic light emitting display device includes an organic light emitting diode shown in FIG. 1. The organic light emitting diode includes an organic compound layer 30a through 30e interposed between an anode electrode 18 corresponding to a pixel electrode and a cathode electrode 28 corresponding to a common electrode.

The organic compound layer 30a through 30e includes a hole injection layer 30a, a hole transport layer 30b, an emission layer 30c, an electron transport layer 30d and an electron injection layer 30e.

If a driving voltage is applied between the anode electrode 18 and the cathode electrode 28, holes passing through the hole transport layer 30b and electrons passing through the electron transport layer 30d are drifted into the emission layer 30c, thereby generating excitons. In accordance therewith, the emission layer 30c can emit visible light.

The organic light emitting display device includes pixels which each have the organic light emitting diode of the above-mentioned structure and are arranged in a matrix shape. Such an OLED device selectively controls the pixels using data voltages and scan voltages, in order to display an image.

FIG. 2 is an equivalent circuit diagram showing a pixel region of an ordinary organic light emitting display device.

Referring to the equivalent circuit of FIG. 2, an organic light emitting display device of an active matrix type includes a pixel of a 2T1C mode as an example. The pixel of the 2T1C mode includes two thin film transistors and a single capacitor.

Such a pixel of the active matrix type organic light emitting display device includes an organic light emitting diode OLED, a switching thin film transistor SW, a driving thin film transistor DR and a storage capacitor Cst within a pixel region which are defined by a data line DL and a gate line GL crossing each other.

The switching thin film transistor SW is turned-on in response to a scan pulse from the gate line GL and forms a current path between its source and drain electrodes. During the turned-on period of the switching thin film transistor SW, a data voltage is applied from the data line DL to the driving thin film transistor DR and the storage capacitor Cst via the source electrode and the drain electrode of the switching thin film transistor SW.

The driving thin film transistor DR controls the quantity of a current flowing through the organic light emitting diode OLED according to the data voltage applied to its gate electrode. The storage capacitor Cst stores a different voltage between the data voltage and a low power supply voltage VSS, and constantly maintains the different voltage for a single frame interval.

However, the storage capacitor Cst of the organic light emitting display device of the related art is prepared by forming a first storage electrode in a storage capacitor region at the formation of gate electrodes of the switching and driving thin film transistors SW and DR, and then forming a second storage electrode overlapping with the first storage electrode at the formation of the source/drain electrodes of the switching and driving thin film transistors. As such, all the storage electrodes must be formed from an opaque metal.

In other words, the storage electrodes positioned within the pixel region must be formed from an opaque metal. Due to this, the aperture ratio of the pixel must deteriorate. Also, it is difficult to increase the capacitance of the storage capacitor through the expansion of the storage electrodes.

BRIEF SUMMARY

Accordingly, embodiments of the present application are directed to an organic light emitting display device and a fabricating method thereof that substantially obviate one or more of problems due to the limitations and disadvantages of the related art.

The embodiments are to provide an organic light emitting display device and a fabricating method thereof which are adapted to enhance an aperture ratio of a pixel by forming storage electrodes of a storage capacitor in a pixel region using a transparent electrode material.

Also, the embodiments are to provide an organic light emitting display device and a fabricating method thereof which are adapted to enhance an aperture ratio of a pixel by forming transparent storage electrodes in a pixel region using a transparent electrode material without any additional process.

Moreover, the embodiments provide an organic light emitting display device and a fabricating method thereof increase the capacitance of a storage capacitor by forming storage electrodes of a storage capacitor in a pixel region using a transparent electrode material and expanding a formation region of the storage electrodes.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems of the related art, a manufacturing method of an OLED display device according to a general aspect of the present embodiment includes: sequentially forming a first metal film, an insulation film and a second metal film on a substrate; forming a photosensitive film pattern having different thickness portions on the second metal film through a mask procedure, wherein the photosensitive film pattern is formed opposite a storage capacitor region, a pixel region and a pad region; forming a first storage electrode, an insulation film pattern and a metal film pattern by sequentially etching the first metal film, the insulation film and the second metal film using the first photosensitive film pattern as a mask; forming a second photosensitive film pattern by performing an ashing process on the first photosensitive film pattern; forming a storage capacitor configured with the first storage electrode, a second insulation film pattern and a second storage electrode by etching the first insulation film pattern and the metal film pattern using the second photosensitive film pattern as a mask; forming a switching transistor and a driving transistor, each including with a channel layer, a gate electrode, a source electrode and a drain electrode, on the substrate provided with the storage capacitor; forming a color filter in the pixel region of the substrate provided with the switching and driving transistors and the storage capacitor; and forming an organic light emitting diode, which includes a first electrode, an organic emission layer and a second electrode, in the pixel region of the substrate provided with the color filter.

An organic light emitting display device according to another general aspect of the present embodiment includes: a substrate having a transistor region, a storage capacitor region, a pixel region and a pad region; at least one transistor arranged in the transistor region of the substrate and configured to include a channel layer, an insulation film, a gate electrode, a source electrode and a drain electrode; a storage capacitor arranged in the storage capacitor region, the pixel region and the pad region of the substrate and configured to include a first storage electrode, an insulation film pattern and a second storage electrode; a color filter arranged over the storage capacitor opposite to the pixel region; and an organic light emitting diode arranged on the color filter and configured to include a first electrode, an organic emission layer and a second electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
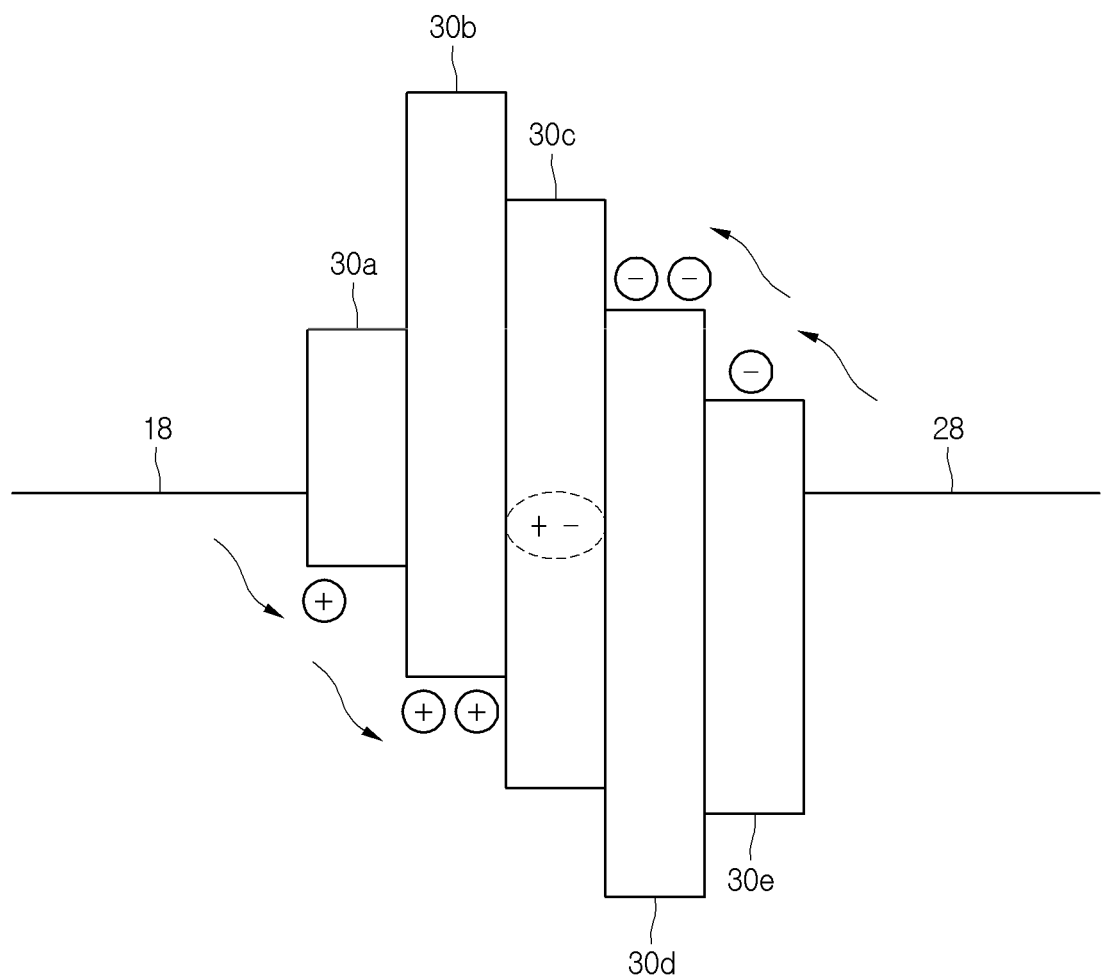
FIG. 1 is a diagram illustrating an emission principle of an organic light emitting diode formed an ordinary OLED device.
Figure 2:
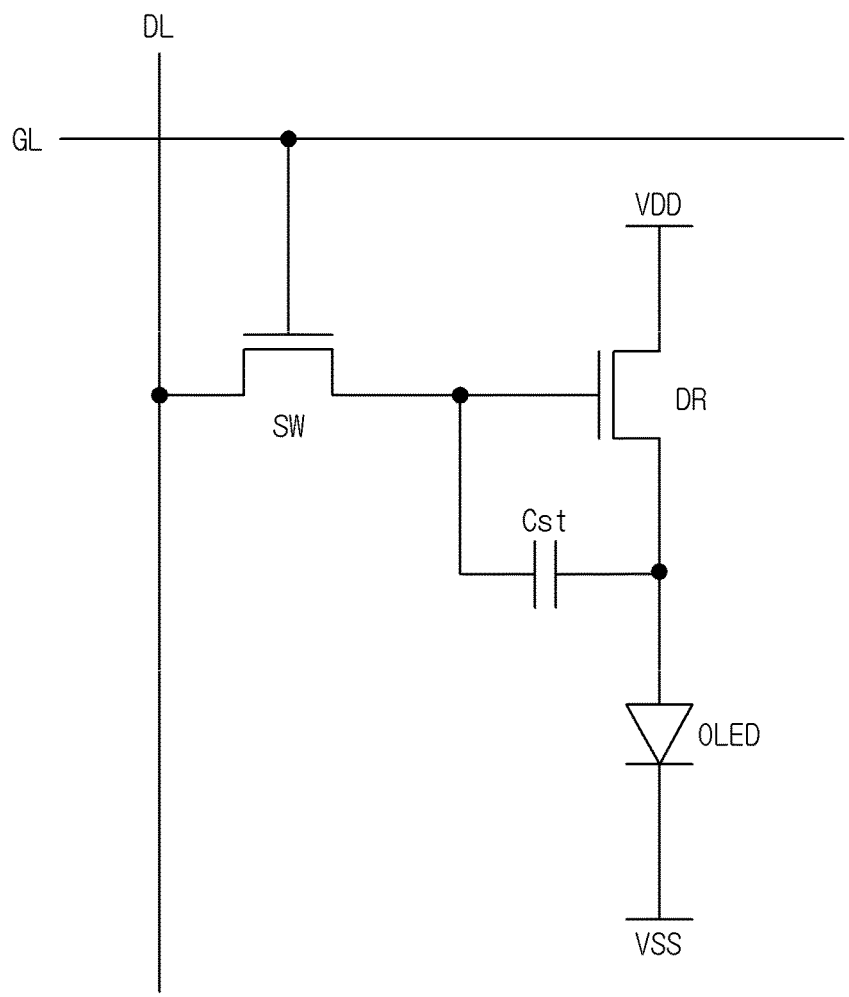
FIG. 2 is an equivalent circuit diagram showing a pixel region of an ordinary OLED device.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIGS. 3A-3M are cross-sectional views illustrating a fabricating method of an OLED device according to an embodiment of the present disclosure.

Referring to FIGS. 3A through 3M, a method of fabricating an organic light emitting display device according to an embodiment of the present disclosure forms a metal film on a substrate 100 which is defined into a data line region Data, a switching transistor region SW-TFT, a driving transistor region DR-TFT, a storage capacitor region Cst, a pixel region Pixel and a pad region PAD.

Figure 3A:
FIGS. 3A and 3M are cross-sectional views illustrating a fabricating method of an OLED device according to an embodiment of the present disclosure.

The substrate 100 is formed from a transparent insulation material. The metal film is patterned through a first mask procedure and allows a light shield layer 110 to be formed in the data line region Data, the switching transistor region SW-TFT and the driving transistor region DR-TFT as shown in FIG. 3A.

Then, a first metal film 120, an insulation film 130 and a second metal film 140 are sequentially formed on the entire surface of the substrate 100 provided with the light shield layer 110. Also, a photosensitive film is formed on the entire surface of the second metal film 140.

Figure 3B:
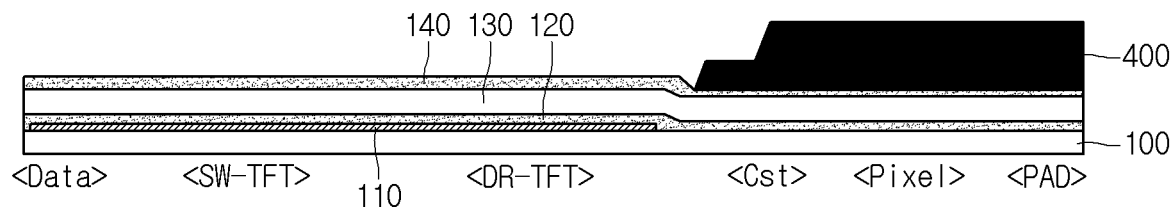

A light exposure process and a development process are performed for the substrate 100, on which the photosensitive film is formed, using one of a diffractive mask and a halftone mask. In accordance therewith, a first photosensitive film pattern 400 is formed on the second metal film 140 corresponding to the storage capacitor region Cst, the pixel region Pixel and the pad region PAD, as shown in FIG. 3B.

The first photosensitive film pattern 400 is formed to regionally have different thicknesses from each other by one of the diffractive mask and the halftone mask. For example, the first photosensitive film pattern 400 is formed thinner in a part of the storage capacitor region Cst compared to the other regions (i.e., the other part of the storage capacitor region Cst, the pixel region Pixel and the pad region PAD).

The first metal film 120 and the second metal film 140 can be formed from a transparent conductive material. For example, the first metal film 120 and the second metal film 140 can be formed from one of indium-tin-oxide ITO, indium-zinc-oxide IZO and indium-tin-zinc-oxide ITZO.

The insulation film 130 interposed between the first and second metal films 120 and 140 can be formed in a single layer structure which is formed from one of a silicon oxide SiOx, such as $SiO_2$, and a silicon nitride SiNx. Alternatively, the insulation film 130 can be formed in a multi-layered structure by alternately depositing a silicon nitride SiNx and a silicon oxide SiOx on the first metal film 120.

Figure 3C:
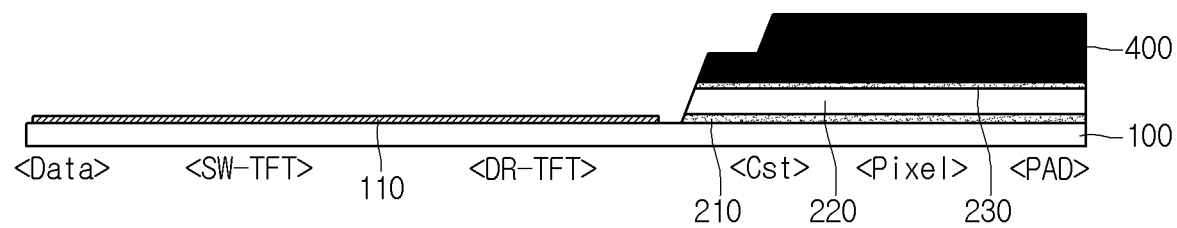

After the first photosensitive film pattern 400 is formed as described above, an etch process is performed for the above-mentioned substrate 100 using the first photosensitive film pattern 140 as a mask, as shown in FIG. 3C. The etch process can be a wet etch process. Alternatively, the etch process can be performed using a mixing method of a wet etch process and a dry etch process.

The above-mentioned etch process allows a first storage electrode 210, a first insulation film pattern 220 and a metal film pattern 230 to be formed on the substrate 100 opposite to the first photosensitive film pattern 400 in a stacked structure.

Figure 3D:
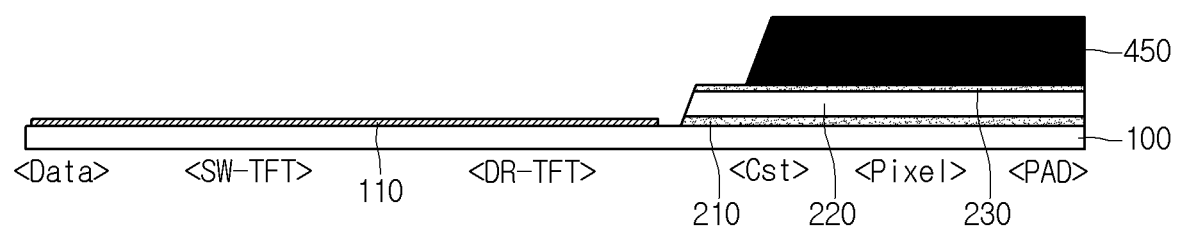

Thereafter, an ashing process is performed for the first photosensitive film pattern 400. In accordance therewith, a second photosensitive film pattern 450 is formed on the metal film pattern 230 as shown in FIG. 3D. The second photosensitive film pattern 450 can be a photosensitive film pattern not existing in a part of the storage capacitor region Cst but having a uniform thickness.

As such, parts of the metal film pattern 230, the first insulation film pattern 220 and the first storage electrode 210 are exposed in a part of the storage capacitor region Cst.

Figure 3E:
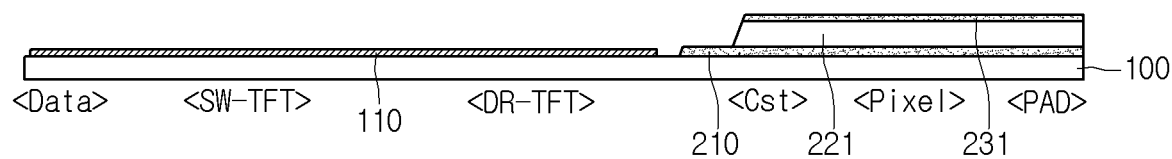

Afterward, a second etch process is performed for the metal film pattern 230 and the insulation film pattern 220 of the substrate 100 using the second photosensitive film pattern 450. In accordance therewith, a second insulation film pattern 221 and a second storage electrode 231 are formed on the first storage electrode 210, as shown in FIG. 3E.

In this way, the present disclosure allows all the first and second storage electrodes 210 and 231 to be formed from a transparent electrode material without any additional mask procedure. As such, an aperture ratio of the pixel is increased.

The first and second storage electrodes 210 and 231 formed from the transparent electrode material can expand from the storage capacitor region Cst up to the pixel region Pixel and the pad region PAD. As such, the capacitance of the storage capacitor can increase.

Figure 3F:
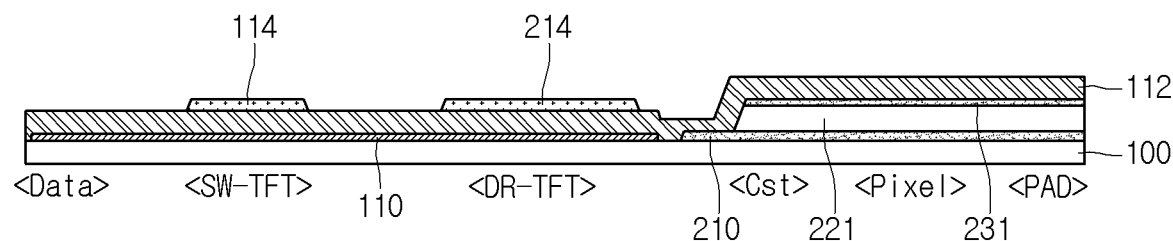

After the first and second storage electrodes 210 and 231 are formed on the substrate 100 as described above, a buffer layer 112 is formed on the entire surface of the above-mentioned substrate 100. Also, a first channel layer 114 and a second channel layer 214 are formed on the buffer layer 112 corresponding to the switching transistor region SW-TFT and the driving transistor region DR-TFT by forming a semiconductor layer on the buffer layer 112 and patterning the semiconductor layer, as shown in FIG. 3F.

The first and second channel layers 114 and 214 can become a semiconductor layer including a crystalline silicon film and an ohmic contact layer. Alternatively, the first and second channel layers 114 and 214 can be an oxide semiconductor layer.

The oxide semiconductor layer can be formed from an amorphous oxide which includes at least one of indium In, zinc Zn, gallium Ga and hafnium Hf. For example, if the oxide semiconductor layer of Ga—In—Zn—O is formed through a sputtering process, either three targets formed from $In_2O_3$, $Ga_2O_3$ and ZnO can be used or a single target formed from a Ga—In—Zn oxide can be used. As another example, when the oxide semiconductor layer of Hf—In—Zn—O is formed through a sputtering process, either three targets formed from $HfO_2$, $In_2O_3$ and ZnO can be used or a single target formed from an Hf—In—Zn oxide can be used.

Figure 3G:
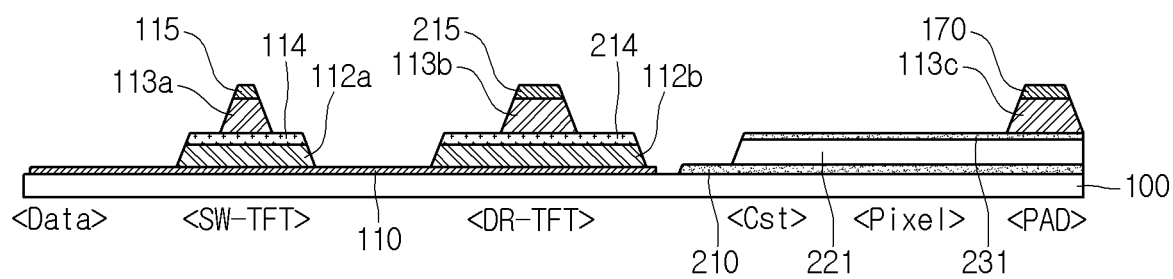

Subsequently, a gate insulation film and a gate metal film are sequentially formed on the entire surface of the substrate 100 provided with the first and second channel layers 114 and 214, and a mask procedure is performed for the gate metal film and the gate insulation film. In accordance therewith, not only a first gate electrode 115 is formed over the first channel layer 114 but also a second gate electrode 215 is formed over the second channel layer 214, as shown in FIG. 3G.

The gate insulation film can be formed in a single layer structure which is formed from one of a silicon oxide SiOx and a silicon nitride SiNx. Alternatively, the gate insulation film can be formed in a multi-layered structure by alternately depositing a silicon nitride SiNx and a silicon oxide SiOx.

A first gate insulation film pattern 113a is formed between the first gate electrode 115 and the first channel layer 114. A second gate insulation film pattern 113b is formed between the second gate electrode 215 and the second channel layer 214. A pad portion 170 and a third gate insulation film pattern 113c are formed in a stacked structure on the second storage electrode 231 corresponding to the pad region PAD.

The gate metal film can be a single layer which is formed from one of opaque conductive materials with a low resistance, such as aluminum Al, an aluminum alloy, tungsten W, copper Cu, nickel Ni, chromium Cr, molybdenum Mo, titanium Ti, platinum Pt, tantalum Ta and so on. Alternatively, the gate metal film can be formed in a double layered structure which includes a first layer formed from one of the above-mentioned opaque conductive materials and a second layer formed from an alloy of the above-mentioned opaque conductive materials. Also, the gate metal film can be formed in a multi-layered structure by stacking at least three metal films.

Figure 3H:
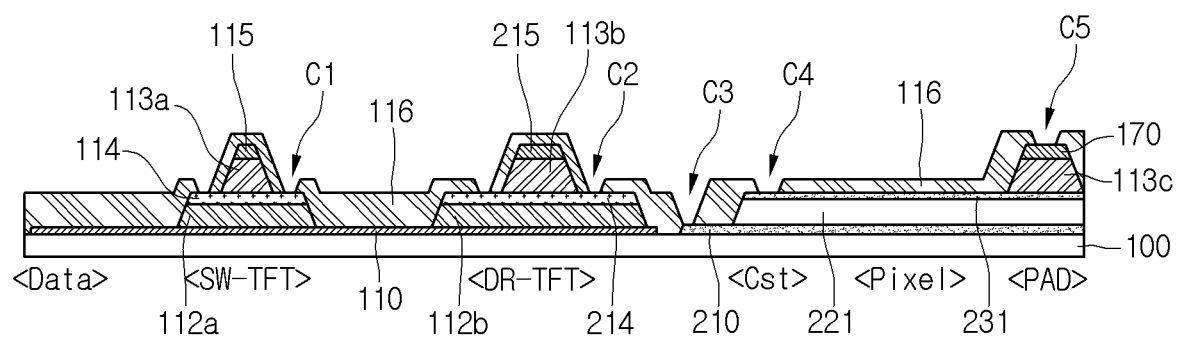

After the first and second gate electrodes 115 and 215 are formed on the substrate 100 as described above, an interlayer insulation film 116 is formed on the entire surface of the substrate 100 provided with the first and second gate electrodes 115 and 215, as shown in FIG. 3H. Also, contact holes are formed in the interlayer insulation film 116 through a mask procedure.

The contact holes include first through fifth contact holes C1 through C5. The first through fifth contact holes C1 through C5 expose a part of the first channel layer 114, a part of the second channel layer 214, a part of the first storage electrode 210, a part of the second storage electrode 231 and a part of the pad portion 170.

Figure 3I:
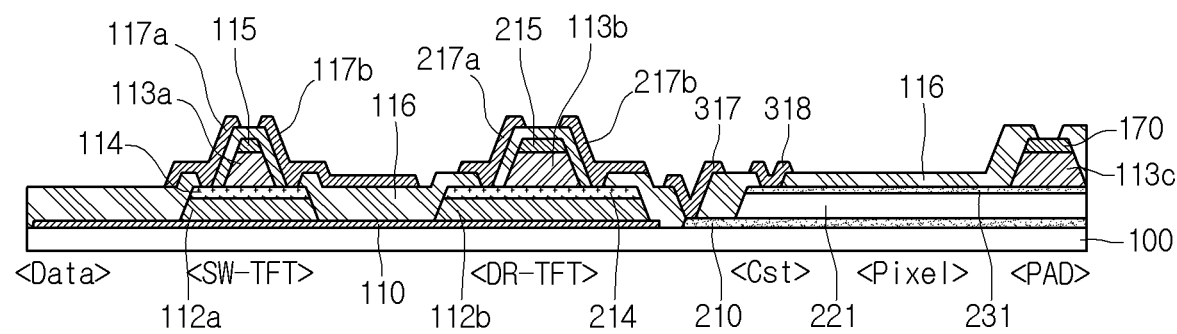

When the contact holes C1 through C5 are formed in the interlayer insulation film 116 as described above, a source/drain metal film is formed on the entire surface of the above-mentioned substrate 100 (i.e., on the interlayer insulation film 116) and then a mask procedure is performed for the source/drain metal film. In accordance therewith, a first source electrode 117a, a second source electrode 217a, a first drain electrode 117b, a second drain electrode 217b, a first contact portion 317 and a second contact portion 318 are formed on the interlayer insulation film 116, as shown in FIG. 3I.

The source/drain metal film can be formed from one of opaque conductive materials with a low resistance. The opaque conductive materials can include aluminum Al, an aluminum alloy, tungsten W, copper Cu, nickel Ni, chromium Cr, molybdenum Mo, titanium Ti, platinum Pt, tantalum Ta and so on. Alternatively, the source/drain metal film can be formed in a multi-layered structure including at least one transparent conductive material layer and at least one opaque conductive material layer. The transparent conductive material layer can be formed from one of indium-tin-oxide ITO, indium-zinc-oxide IZO and indium-tin-zinc-oxide ITZO.

The first gate electrode 115, the first channel layer 114, the first gate insulation film pattern 113a, the first source electrode 117a and the first drain electrode 117b form a switching transistor. The second gate electrode 215, the second channel layer 214, the second gate insulation film pattern 113b, the second source electrode 217a and the second drain electrode 217b form a driving transistor.

Figure 3J:
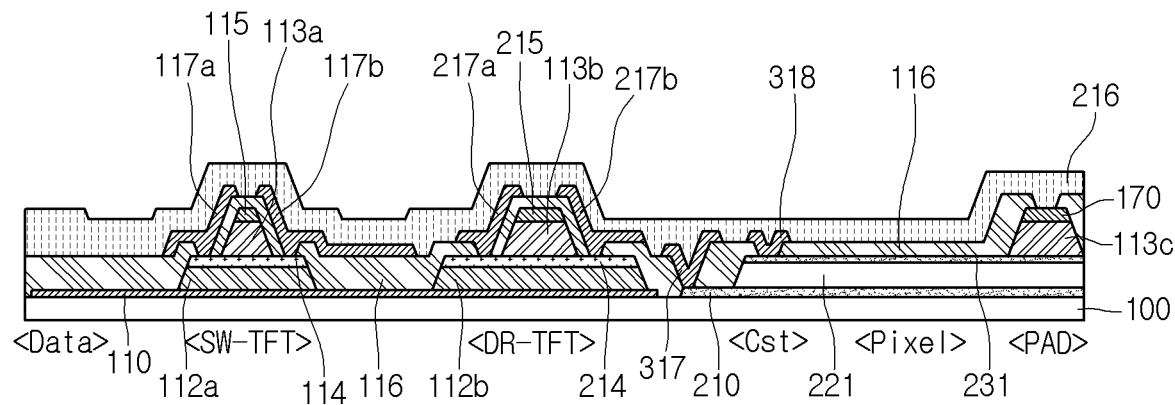
Figure 3K:
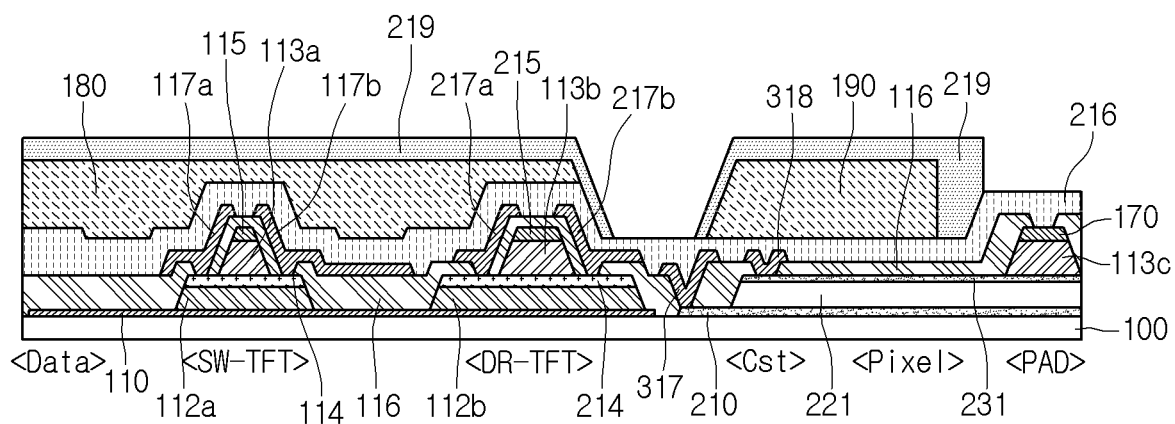

After the switching transistor and the driving transistor are completed as described above, a passivation film 216 is formed on the entire surface of the substrate 100 provided with the switching transistor and the driving transistor as shown in FIG. 3J. A color filter layer 190 is formed in a pixel region on the passivation film 216 as shown in FIG. 3K. Also, a color filter pattern 180 is formed in a non-display region on the passivation film 216 in which the switching transistor and the driving transistor are formed.

The color filter layer 190 can include red, green and blue color filter layers which are sequentially formed according to the pixel regions. The color filter pattern 180 can be formed from the same color filter material as the color filter layer of the respective pixel.

After the color filter layer 190 and the color filter pattern 180 are formed on the substrate 100 as described above, an overcoat layer 219 for surface planarization is formed on the entire surface of the above-mentioned substrate 100 as shown in FIG. 3K.

Figure 3L:
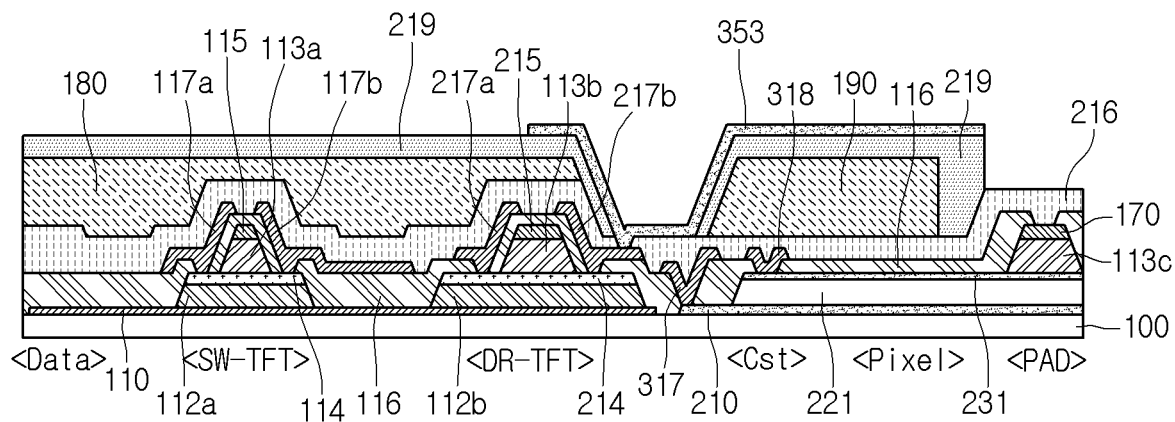

Subsequently, a transparent conductive material layer is formed on the entire surface of the substrate 100 provided with the overcoat layer 219, and then a mask procedure is performed for the transparent conductive material layer. In accordance therewith, a first electrode 353 is formed on the overcoat layer 219 opposite to the color filter layer 190 as shown in FIG. 3L.

If the organic light emitting display device is a bottom emission mode, the first electrode 353 can be a cathode electrode of the organic light emitting diode.

Figure 3M:
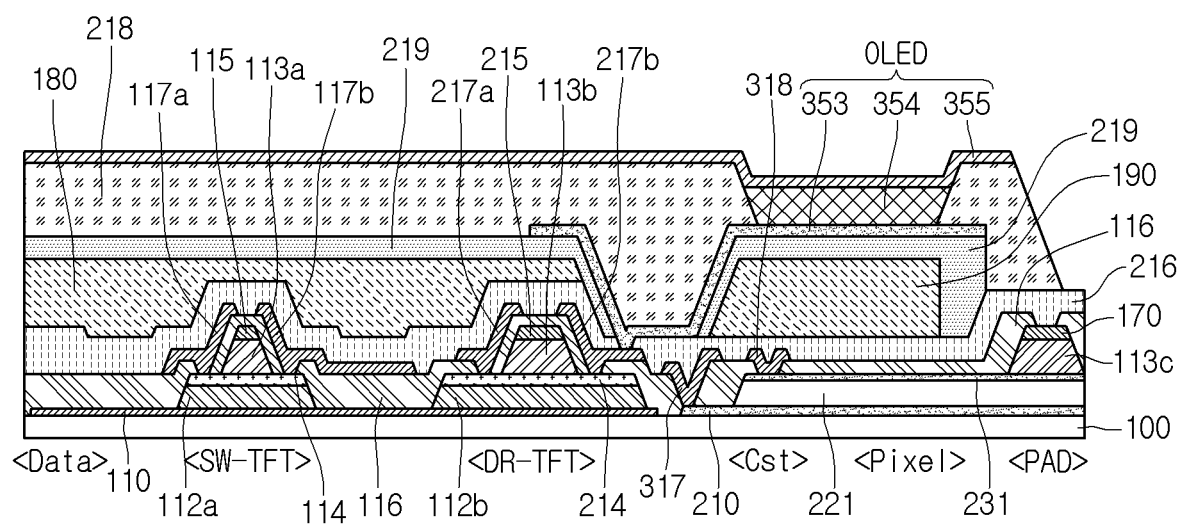

After the first electrode 353 is formed in the pixel region Pixel as described above, a bank layer 218 is formed by forming an insulation layer on the above-mentioned substrate 100 and performing a mask procedure for the insulation layer, as shown in FIG. 3M. The bank layer 218 exposes the pixel region Pixel. As such, the first electrode 353 is exposed in the pixel region Pixel. Subsequently, an organic emission layer 354 is formed on the exposed first electrode 353.

After the organic emission layer 354 is formed on the first electrode 353 as described above, a second electrode 355 is formed on the entire surface of the above-mentioned substrate 100. In accordance therewith, an organic light emitting diode OLED configured with the first and second electrodes 353 and 355 and the organic emission layer 354 is completed.

The organic emission layer 354 can include a hole injection layer HIL, a hole transport layer HTL, an emission layer EML, an electron transport layer ETL and an electron injection layer EIL. The hole transport layer HTL can include an electron blocking layer EBL. The electron transport layer ETL can be formed from a low molecular material such as PBD, TAZ, Alq3, BAlq, TPBI or Bepp2.

The emission layer EML of the organic emission layer 354 can emit color light in accordance with an organic material. As such, red, green and blue emission layers can be formed in the pixel regions Pixel, in order to realize full color. Alternatively, the emission layer can be become a white emission layer which is formed by stacking red, green and blue organic materials and emits white light, in order to realize full color.

The present disclosure allows color filters to be formed in the pixel regions of the substrate 100. As such, it is preferable for the emission layer EML to emit white light.

The organic light emitting display device and the fabricating method thereof according to the present disclosure form the storage electrodes using a transparent electrode material, in order to implement a storage capacitor in the pixel region. As such, an aperture ratio of the pixel can be enhanced.

Also, the organic light emitting display device and the fabricating method thereof according to the present disclosure enhance an aperture ratio of the pixel by forming storage electrodes in a pixel region using a transparent electrode material without any additional process.

Moreover, the organic light emitting display device and the fabricating method thereof according to the present disclosure can form storage electrodes of a storage capacitor in a pixel region using a transparent electrode material and expand the formation region of the storage electrodes. Therefore, the capacitance of a storage capacitor can increase.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device, comprising:
a substrate having a transistor region, a storage capacitor region, a pixel region and a pad region;
at least one transistor in the transistor region of the substrate and configured to include a channel layer, an insulation film, a gate electrode, a source electrode and a drain electrode;
a storage capacitor in the storage capacitor region and configured to include a first storage electrode, an insulation film pattern and a second storage electrode; an interlayer insulation layer in contact with both an upper part of the first storage electrode and an upper part of the second storage electrode and having a first storage contact hole on the first storage electrode and a second storage contact hole on the second storage electrode, the first and second storage contact holes filled with a same material as the source and drain electrodes of the at least one transistor, wherein the interlayer insulation layer is not in contact with a lower part of the first storage electrode and a lower part of the second storage electrode;
a color filter over the storage capacitor corresponding to the pixel region; and
an organic light emitting diode on the color filter and configured to include a first electrode, an organic emission layer and a second electrode,
wherein both the first storage electrode and the second storage electrode extend in the pixel region and the pad region of the substrate,
wherein the pad region includes a pad portion and a gate insulation film pattern formed in a stacked structure on the second storage electrode, and
wherein the pad portion is made of the same material as the gate electrode.

2. The organic light emitting display device of claim 1, wherein the first storage electrode and the second storage electrode are formed from a transparent conductive material.

3. The organic light emitting display device of claim 1, wherein the first storage electrode and the second storage electrode are one of indium-tin-oxide ITO, indium-zinc-oxide IZO and indium-tin-zinc-oxide ITZO.

4. The organic light emitting display device of claim 1, wherein the insulation film pattern of the storage capacitor is one of a silicon nitride SiNx and silicon oxide SiOx.

5. The organic light emitting display device of claim 1, wherein the insulation film pattern of the storage capacitor has a multi-layered structure having alternating layers of silicon nitride SiNx and silicon oxide SiOx.

6. The organic light emitting display device of claim 1, wherein the organic emission layer includes a white emission layer that emits white light.

7. The organic light emitting display device of claim 6, wherein the white emission layer includes stacked red, green and blue organic materials.

8. An organic light emitting display device, comprising:
a substrate having a transistor region, a storage capacitor region, a pixel region and a pad region;
at least one transistor arranged in the transistor region of the substrate and configured to include a channel layer, an insulation film, a gate electrode, a source electrode and a drain electrode;
a storage capacitor arranged in the storage capacitor region, the pixel region and the pad region of the substrate and configured to include a first storage electrode, an insulation film pattern and a second storage electrode;
an interlayer insulation layer in contact with both an upper part of the first storage electrode and an upper part of the second storage electrode and having a first storage contact hole on the first storage electrode and a second storage contact hole on the second storage electrode, the first and second storage contact holes filled with a same material as the source and drain electrodes of the at least one transistor, wherein the interlayer insulation layer is not in contact with a lower part of the first storage electrode and a lower part of the second storage electrode; and
an organic light emitting diode arranged in the pixel region and configured to include a first electrode, an organic emission layer and a second electrode,
wherein both the first storage electrode and the second storage electrode extend in the pixel region and the pad region of the substrate,
wherein the pad region includes a pad portion and a gate insulation film pattern formed in a stacked structure on the second storage electrode, and
wherein the pad portion is made of the same material as the gate electrode.

9. A thin film transistor array substrate, comprising:
a substrate having a transistor region, a storage capacitor region, a pixel region and a pad region;
at least one transistor arranged in the transistor region of the substrate and configured to include a channel layer, an insulation film, a gate electrode, a source electrode and a drain electrode; and
a storage capacitor arranged in the storage capacitor region, the pixel region and the pad region of the substrate and configured to include a first storage electrode, an insulation film pattern and a second storage electrode;
an interlayer insulation layer in contact with both an upper part of the first storage electrode and an upper part of the second storage electrode and having a first storage contact hole on the first storage electrode and a second storage contact hole on the second storage electrode, the first and second storage contact holes filled with a same material as the source and drain electrodes of the at least one transistor, wherein the interlayer insulation layer is not in contact with a lower part of the first storage electrode and a lower part of the second storage electrode,
wherein both the first storage electrode and the second storage electrode extend in the pixel region and the pad region of the substrate,
wherein the pad region includes a pad portion and a gate insulation film pattern formed in a stacked structure on the second storage electrode, and
wherein the pad portion is made of the same material as the gate electrode.

* * * * *